(12) United States Patent
Nagahara

(10) Patent No.: US 6,586,813 B2
(45) Date of Patent: Jul. 1, 2003

(54) HIGH-SPEED COMPOUND SEMICONDUCTOR DEVICE OPERABLE AT LARGE OUTPUT POWER WITH MINIMUM LEAKAGE CURRENT

(75) Inventor: Masaki Nagahara, Nakakoma (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/906,153

(22) Filed: Jul. 17, 2001

(65) Prior Publication Data

US 2002/0005528 A1 Jan. 17, 2002

(30) Foreign Application Priority Data

Jul. 17, 2000 (JP) .......................... 2000-216387

(51) Int. Cl.[7] .......................................... H01L 31/0328
(52) U.S. Cl. .................... 257/472; 257/471; 257/192
(58) Field of Search .................. 257/192, 194, 257/195, 155, 471–476, 485, 196, 197, 198, 199, 200, 201

(56) References Cited

U.S. PATENT DOCUMENTS

| | | | |
|---|---|---|---|
| 4,662,058 A | * | 5/1987 | Cirillo, Jr. et al. |
| 4,889,831 A | * | 12/1989 | Ishii et al. |
| 4,916,498 A | * | 4/1990 | Berenz |
| 5,023,674 A | * | 6/1991 | Hikosaka et al. |
| 5,374,835 A | * | 12/1994 | Shimada et al. |
| 6,294,801 B1 | * | 9/2001 | Inokuchi et al. |

FOREIGN PATENT DOCUMENTS

JP  5-326563  12/1993

OTHER PUBLICATIONS

Li et al., "High breakdown voltage GaN HFET with field plate," Electronics Letters, Feb. 1, 2001, vol. 37, No. 3, p. 196–197.*
C.L. Chen et al., IEEE Electron Device Letters 13, No. 6, New York, Jun. 1992.
N. –Q. Zhang et al.; Extended Abstract of the 1999 International Conference on Solid State Devices and Materials; pp. 212–213, Tokyo, 1999.

* cited by examiner

Primary Examiner—Nathan J. Flynn
Assistant Examiner—Kevin Quinto
(74) Attorney, Agent, or Firm—Armstrong, Westerman & Hattori, LLP

(57) ABSTRACT

A compound semiconductor device includes a cap layer formed on a channel layer and an insulating film formed on the cap layer, and a Γ-shaped gate electrode is provided in a gate recess opening, wherein an extension part of the Γ-shaped gate electrode extends over the insulating film toward a drain electrode, and the total thickness of the insulating film and the cap layer being is set such that the electric field formed right underneath the extension part of the gate electrode includes a component acting in a direction perpendicular to the substrate.

10 Claims, 18 Drawing Sheets

HIGH-SPEED COMPOUND SEMICONDUCTOR DEVICE OPERABLE AT LARGE OUTPUT POWER WITH MINIMUM LEAKAGE CURRENT

CROSS-REFERENCE TO RELATED APPLICATION

The present application is based on Japanese priority application No.2000-216387 filed on Jul. 17, 2000, the entire contents of which are hereby incorporated by reference.

BACKGROUND OF THE INVENTION

The present invention generally relates to semiconductor devices and more particularly to a high-power and high-speed semiconductor device.

With widespread use of mobile telecommunication technology, there is a demand for high-power and high-speed semiconductor devices for use in base stations as final stage amplifiers, and the like.

Conventionally, high-power semiconductor devices have been realized by increasing the gate width so as to increase the drive current. However, such an approach has a drawback, associated with the increased output current, of large power loss occurring in an impedance matching circuit that is used in combination with the semiconductor device. In view of this problem, recent high-power semiconductor devices achieve the desired increase of output power by increasing the operating voltage.

FIG. 1 shows the construction of a conventional high-power, high-speed semiconductor device 10.

Referring to FIG. 1, the semiconductor device 10 is a MESFET formed on a semi-insulating GaAs substrate 11, and includes a buffer layer 11A of undoped GaAs formed on the GaAs substrate 11, a channel layer 12 of n-type GaAs formed on the buffer layer 11A, a Schottky contact layer 13 of undoped AlGaAs formed on the channel layer 12, and a cap layer 14 of undoped GaAs formed on the Schottky contact layer 13. Further, a gate electrode 15 makes a Schottky contact with the Schottky contact layer 13 in a gate recess structure formed in the cap layer 14, and n+-type diffusion regions 16 and 17 are formed at respective sides of the gate electrode 15 with a separation therefrom. Each of the diffusion regions 16 and 17 extends from the cap layer 14 to the buffer layer 11A and forms a source region or a drain region. Further, a source electrode 16A is formed on the source region 16 in ohmic contact therewith, and a drain region 17A is formed on the drain region 17 also in ohmic contact therewith.

In the MESFET 10 of FIG. 1, the exposed part of the cap layer 14 is covered by a passivation film 18 of SiN.

In the case the MESFET 10 is driven so as to provide large output power, it is necessary to apply a large voltage between the gate electrode 15 and the drain electrode 17A.

On the other hand, the use of such a large operational voltage tends to cause the problem of excessive electric field strength in the channel region formed underneath the gate electrode 15, particularly in the vicinity of the drain edge. The large electric field thus induced in the vicinity of the drain edge may cause the problem of avalanche breakdown in the channel region as represented in FIG. 2. When this occurs, a large gate leak current is caused to flow along a path (1) as represented in FIG. 2, and the desired high-power operation of the MESFET 10 becomes no longer possible.

Further, there may exist another leakage current path (2) in the conventional MESFET 10 of FIG. 1 as represented in FIG. 2, although the magnitude of the leakage current along the path (1) is larger than the leakage current along the path (2) by the factor of ten or more.

In order to avoid the problem of gate leakage current, it has been practiced conventionally to increase the distance between the gate electrode 15 and the drain electrode 17A so as to reduce the electric field strength right underneath the gate electrode in the pinch-off mode. According to this approach, it is confirmed that there occurs a desired increase of the gate-drain breakdown voltage and also a desired decrease of the gate leakage current.

On the other hand, the foregoing conventional approach still has a drawback in that, while it can successfully increase the gate-drain breakdown voltage, there also occurs an increase of the source-drain resistance, resulting in a decrease of the maximum output current, and hence a decrease of maximum output power that can be taken out from the semiconductor device. Further, the approach of increasing the gate-drain distance tends to cause the problem of Gunn oscillation.

From the reasons noted before, it will be understood that there exists an inherent limitation in the foregoing conventional approach for realizing high-power operation of MESFET 10 of FIG. 1.

SUMMARY OF THE INVENTION

Accordingly, it is a general object of the present invention to provide a novel and useful semiconductor device wherein the foregoing problems are eliminated.

Another and more specific object of the present invention is to provide a high-speed compound semiconductor device capable of providing large output power.

Another object of the present invention is to provide a high-speed compound semiconductor device operable at large output power with minimized leakage current.

Another object of the present invention is to provide a compound semiconductor device, comprising:

a substrate;

a channel layer formed on said substrate;

a cap layer formed on said channel layer;

an insulating film formed on said cap layer;

a gate recess opening penetrating through said insulating film and said cap layer;

an n-type source region extending from a surface of said cap layer and reaching said channel layer at a first side of said gate electrode;

an n-type drain region extending from a surface of said cap layer and reaching said channel layer at a second side of said gate electrode;

a source electrode contacting with said source region electrically; and a drain electrode contacting with said drain region electrically, said gate electrode having a Γ shape and extending over said insulating film from said gate recess opening in a direction of said second side, a total thickness of said insulating film and said cap layer being set such that there is formed an electric field right underneath an extending part of said gate electrode such that said electric field has a component acting in a direction perpendicular to a principal surface of said substrate with a substantial magnitude.

According to the present invention, it becomes possible to improve the gate breakdown characteristics of a high-speed field-effect semiconductor device by providing thereto a Γ-shaped gate electrode and by optimizing the thicknesses of the passivation film and the cap layer such that the shape of the gate electrode can deform the potential distribution profile in the vicinity of the drain edge. As a result of the present invention, it becomes possible to use a large gate-drain voltage and the semiconductor device can be driven so as to provide a large output power.

Other objects and further features of the present invention will become apparent from the following detailed description when read in conjunction with the attached drawings.

DETAILED DESCRIPTION OF THE INVENTION

Principle

Figure 1:
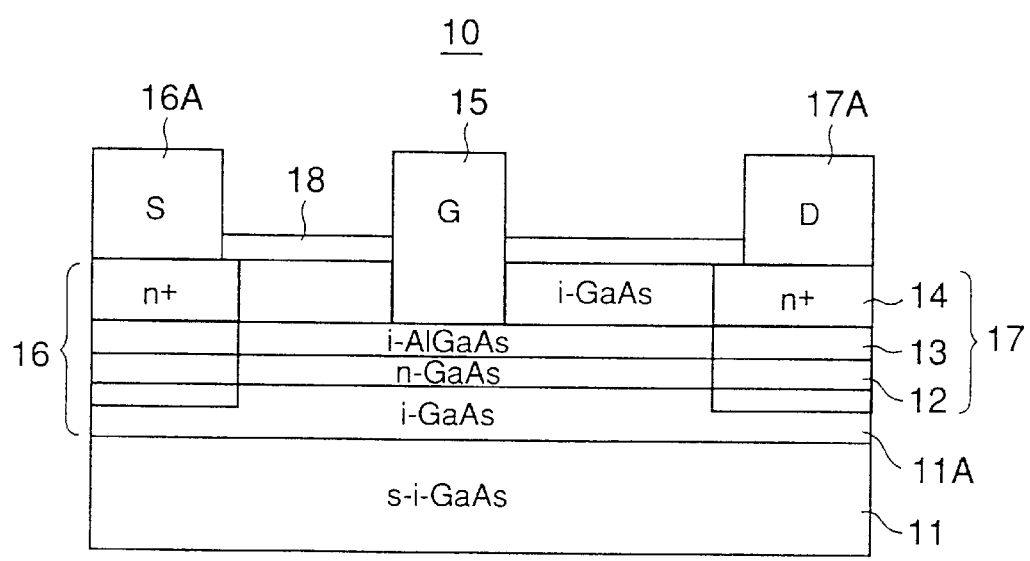
FIG. 1 is a diagram showing the construction of a conventional MESFET.

Hereinafter the principle of the present invention will be explained with reference to FIG. 3, wherein those parts of FIG. 3 corresponding to the parts described previously are designated by the same reference numerals and the description thereof will be omitted.

Figure 3:
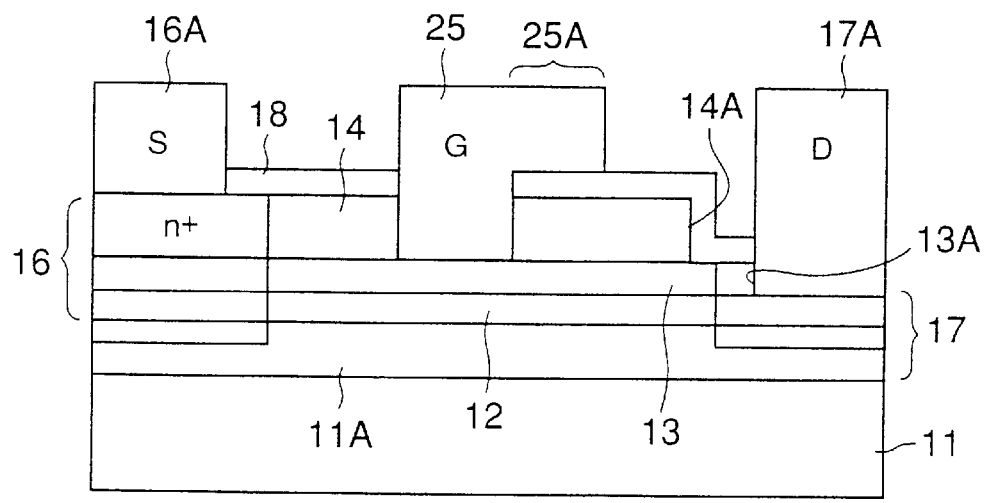
FIG. 3 is a diagram explaining the principle of the present invention.

Referring to FIG. 3, the present invention uses a Γ-shaped gate electrode 25 having an extension part 25A extending over the cap layer 14 in the direction of the drain region 17, in place of the gate electrode 15. Further, it should be noted that the cap layer 14 is covered with a thin passivation film 18. Thus, the extension part 25A of the gate electrode 25 actually extends over the passivation film 18 in the direction toward the drain region 17.

In the structure of FIG. 3, it can be seen that there is formed a drain opening 14A in the cap layer 14 in correspondence to the drain region 17 so as to expose the Schottky contact layer 13, wherein the Schottky contact layer 13 in turn is formed with an opening 13A inside the opening 14A so as to expose the channel layer 12. The drain electrode 17A then makes an ohmic contact with the channel layer 12 in the foregoing opening 13A. It should be noted that the passivation film 18 extends from the surface of the cap layer 14 along the sidewall surface of the drain opening 14A and covers the surface of the Schottky contact layer 13 continuously.

Figure 4A:
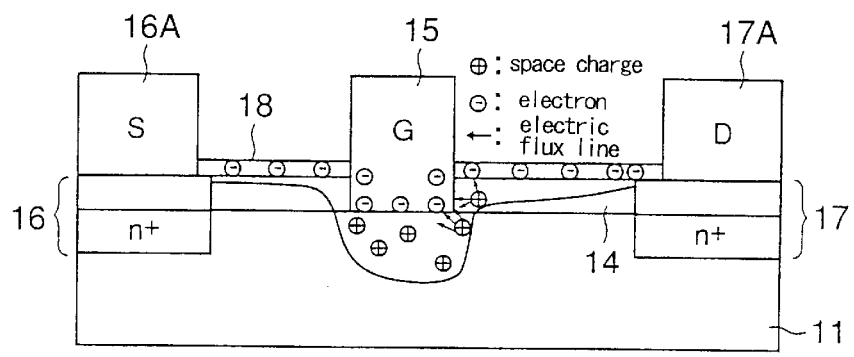
FIGS. 4A and 4B are other diagrams explaining the principle of the present invention.
Figure 4B:
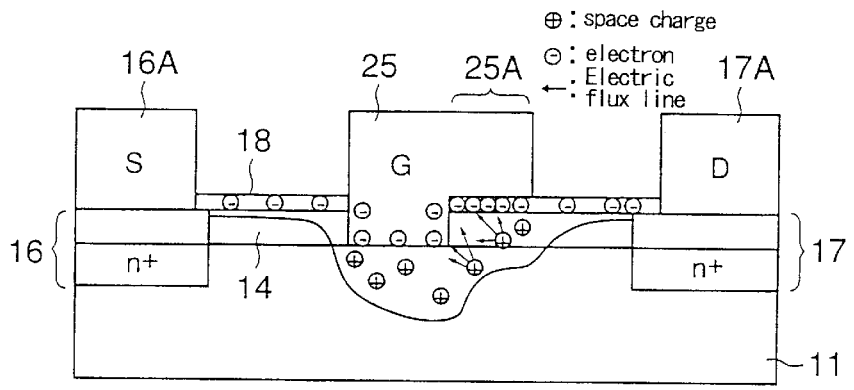

FIGS. 4A and 4B respectively show the state of the depletion layer formed in the MESFET 10 of FIG. 1 and in the MESFET of FIG. 3.

In a MESFET, it is known that there appear space charges in correspondence to the depletion layer extending from the Schottky gate electrode, wherein the space charges thus induced form an electric field together with the electrons that are accumulated in the vicinity of the gate electrode. In FIG. 4A, the arrows represent the electric flux lines associated with such an electric field.

Figure 2:
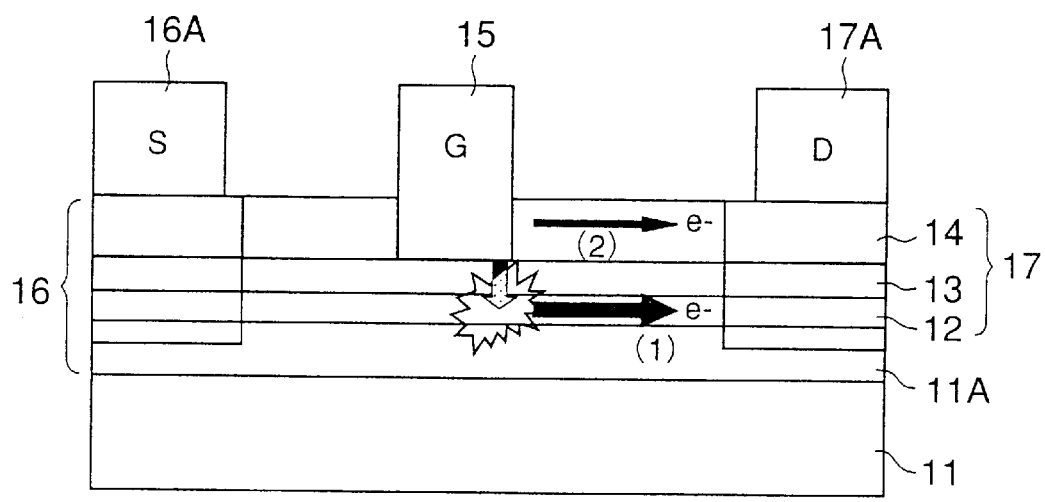
FIG. 2 is a diagram explaining the problem occurring in the MESFET of FIG. 1.

Referring to FIG. 4A, it can be seen that the electric flux lines are pointed mostly in the gate length direction, particularly in the part near the drain edge part of the gate electrode 15, indicating that the electric field component pointing in the gate length direction is predominant in the vicinity of the drain edge of the gate electrode 15 in the MESFET 10 of FIG. 1. Thereby, there is caused a substantial concentration of electric field near the drain edge of the gate electrode 15, while such a concentration of the electric field tends to induce the avalanche breakdown explained with reference to FIG. 2 when the MESFET is operated to provide high output power.

In the case the Γ-shaped electrode 25 is used as represented in the MESFET of FIG. 3, on the other hand, a depletion layer is formed also underneath the extension part 25A of the gate electrode 25 as represented in FIG. 4B. Associated therewith, there is caused an accumulation of electrons right underneath the extension part 25A of the electrode 25, and there occurs an increase of electric field components that are pointing in the direction perpendicular to the principal surface of the substrate, as can be seen from the distribution of the electric flux lines represented in FIG. 4B by arrows. As a result of such an increase of the vertical component of the electric field, the MESFET of FIG. 3 can avoid the problem of concentration of the electric field near the drain edge part of the gate electrode 25.

Meanwhile, the foregoing effect of reducing the concentration of electric field by way of using the Γ-shaped gate electrode depends on the thickness of the cap layer 14 and the thickness of the passivation layer 18 located right underneath the extension part 25A of the gate electrode 25.

Figure 5:
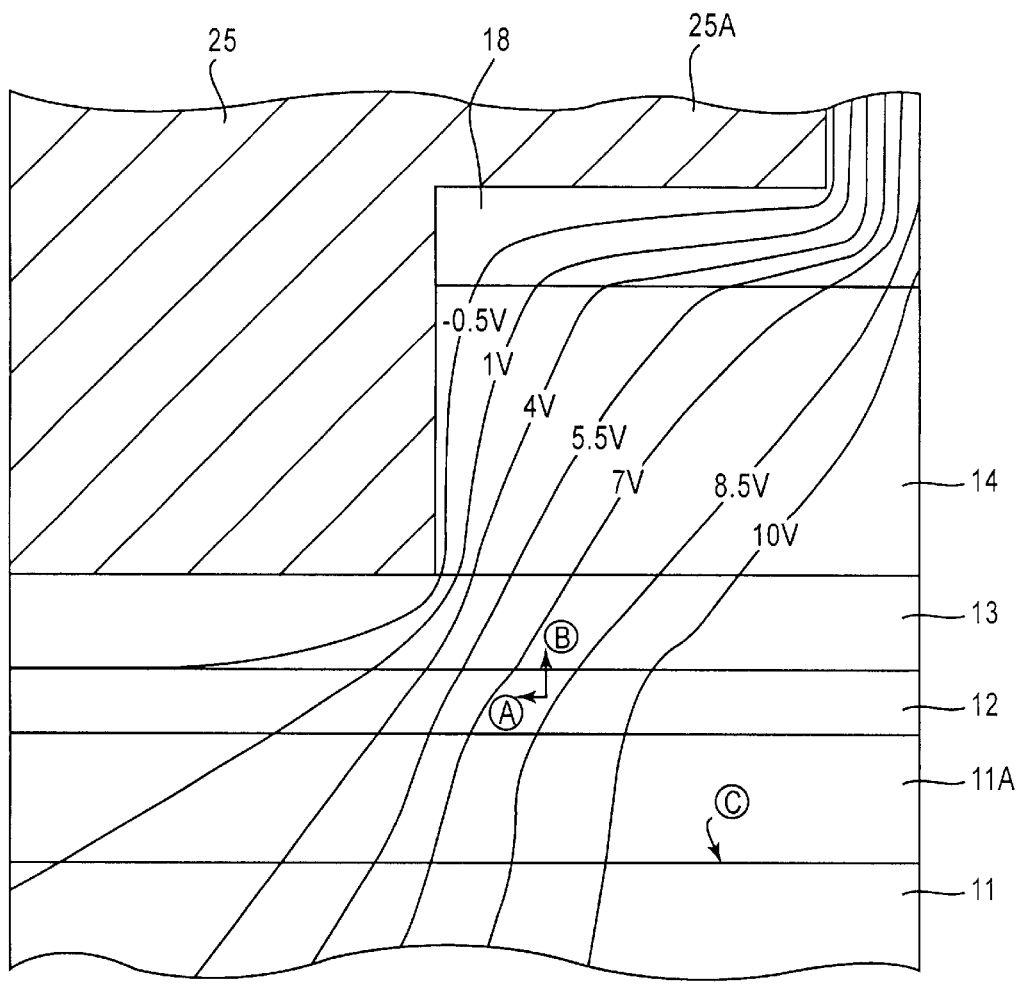
FIG. 5 is a further diagram explaining the principle of the present invention.
Figure 6:
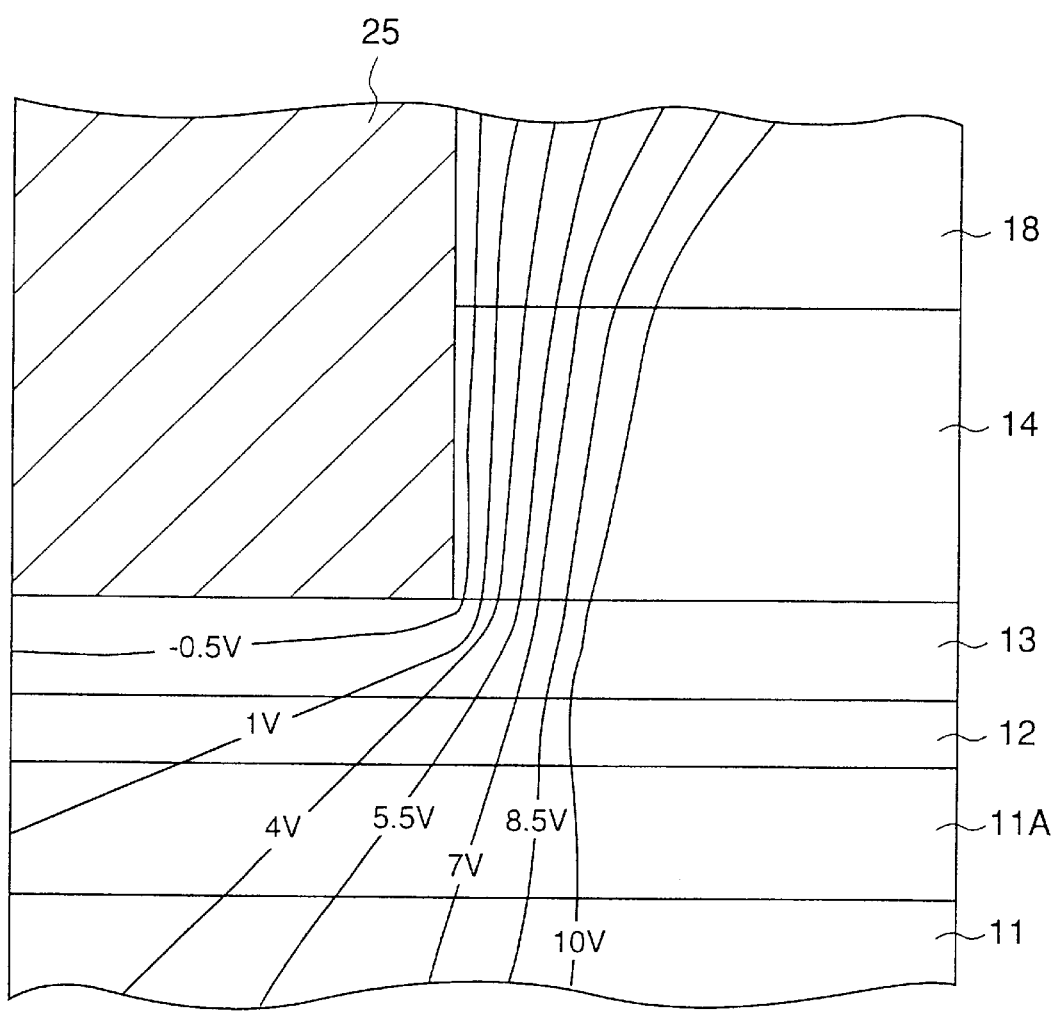
FIG. 6 is a further diagram explaining the principle of the present invention.

FIGS. 5 and 6 show the potential distribution appearing in the MESFET of FIG. 3 for the case the thickness of the passivation film 18 is set to 50 nm and 400 nm, respectively. In FIGS. 5 and 6, it should be noted that the cap layer 14 has a thickness of 130 nm and a voltage of 30 V is applied between the gate electrode 25 and the drain electrode 17A.

Referring to FIG. 5, it can be seen that the potential distribution caused in the MESFET is deformed substantially by the existence of the extension part 25A of the gate electrode 25 when the thickness of the passivation film 18 is set small, and that the foregoing potential deformation causes a substantial relaxation of potential gradient in the vicinity of drain edge of the gate electrode 25. Thus, the MESFET of FIG. 3 can successfully overcome the problem of avalanche breakdown explained with reference to FIG. 2 through the relaxation of the potential gradient near the drain edge of the gate electrode 25.

It should be noted that the potential distribution of FIG. 5 can be interpreted such that the gate extension part 25A has caused a shift of potential distribution profile in the direction of the drain region 17. Associated with such a deformation of the potential distribution profile, not only the electric field components acting in the gate length direction but also the electric field components acting perpendicularly to the substrate surface appear in the cap layer 14 with substantial strength.

In FIG. 5, it can be seen that there is still caused a concentration of electric field in the vicinity of the edge part of the gate extension part 25A facing the drain region. However, such a concentration of electric field is caused at the location above the insulation film 18 and does not induce avalanche breakdown in the channel layer 12.

FIG. 6 shows the case in which the passivation film 18 has the thickness of 400 nm.

Referring to FIG. 6, it can be seen that the effect of the gate extension part 25A is reduced substantially because of the increased thickness of the passivation film 18 as compared with the case of FIG. 5, and there appears a concentration of electric field at the drain edge of the gate electrode 25 as represented by the dense distribution of the potential surfaces. In FIG. 6, it should be noted that the extension part 25A is located above the gate electrode 25 beyond the area of the drawing. From FIG. 6, it can be seen that the electric field components inducted in the cap layer 14 are pointed predominantly in the gate length direction and that the electric field components acting perpendicularly to the substrate principal surface is almost zero.

In the MESFET of such a construction, the problem of avalanche breakdown near the drain edge of the gate electrode and the associated problem of increase of gate leakage current cannot be avoided even when the Γ-shaped gate electrode 25 is used.

When the passivation film 18 is omitted, on the other hand, there is caused a concentration of electric field inside the cap layer 14, leading to avalanche breakdown, as will be explained in detail with reference to FIG. 13. In this case, therefore, the breakdown characteristics of the semiconductor device are degraded. Thus, it is necessary to interpose the passivation film 18 between the extension part 25A of the gate electrode and the cap layer 14.

Figure 7:
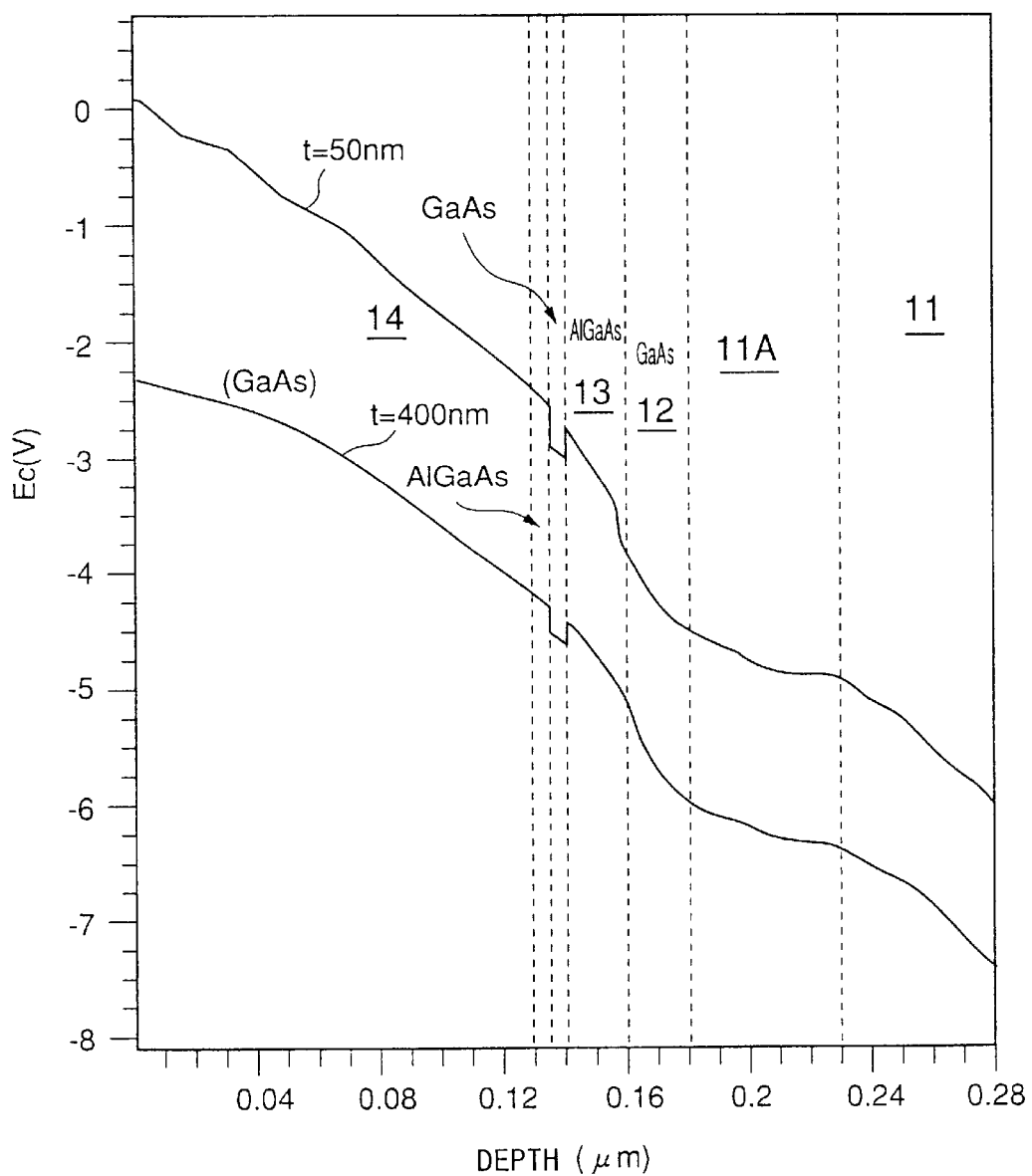
FIG. 7 is a further diagram explaining the principle of the present invention.

FIG. 7 shows the depth profile of conduction band energy Ec for the MESFET of FIG. 3 right underneath the gate extension part 25A for the case the passivation film 18 has a thickness of 50 nm and for the case the passivation film 18 has a thickness of 400 nm. In the depth profile of FIG. 7, it should be noted that there is formed a thin undoped GaAs spacer layer and an undoped AlGaAs etching stopper layer between the Schottky layer 13 and the cap layer 14. In FIG. 7, the origin of the horizontal axis is taken coincident to the surface of the cap layer 14.

Referring to FIG. 7, it can be seen that there appears a generally parallel relationship for the depth profile of the conduction band energy Ec between the case the passivation film 18 has the thickness of 50 nm and the case the passivation film 18 has the thickness of 400 nm excluding the top part of the cap layer 14. In the top part of the cap layer 14, it can be seen that the distribution profile for the case the passivation film has the thickness of 50 nm has a steeper gradient as compared with the distribution profile for the case the passivation film has the thickness of 400 nm. This indicates that a large number of electrons are accumulated underneath the gate extension part 25A when the thickness of 50 nm is used for the passivation layer 18. This accumulation of electrons underneath the gate extension part 25A facilitates the effect of suppressing the avalanche breakdown explained with reference to FIG. 4B, particularly when the thickness of the passivation layer 18 is set to 50 nm.

Figure 8A:
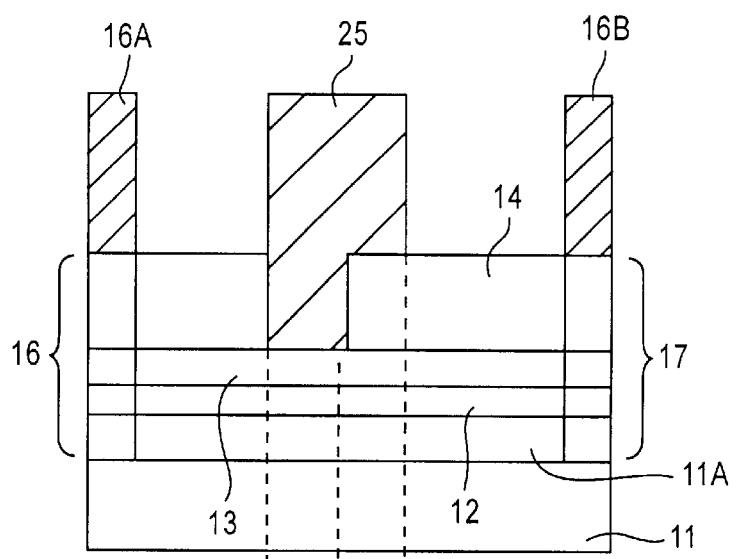
FIGS. 8A and 8B are further diagrams explaining the principle of the present invention.
Figure 8B:
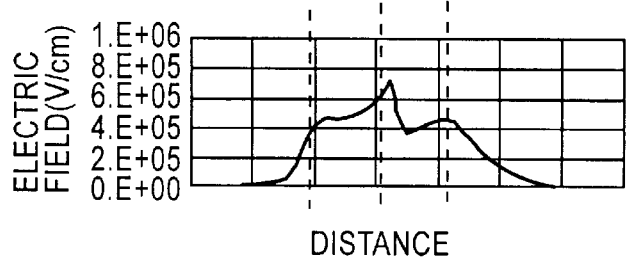
Figure 9A:
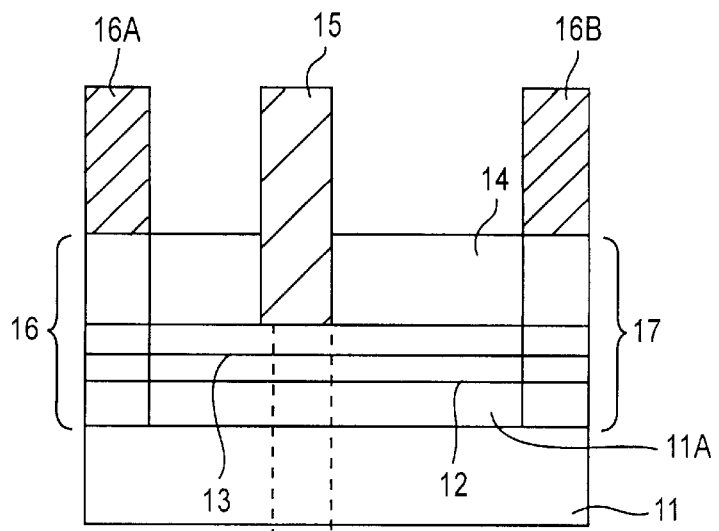
FIGS. 9A and 9B are further diagrams explaining the principle of the present invention.
Figure 9B:
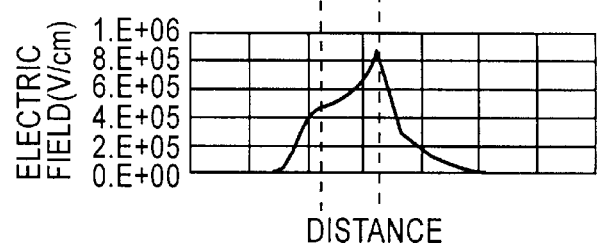

FIG. 8B shows the distribution profile of electric field strength in the channel layer 12 for the MESFET of the present invention represented in FIG. 3, wherein the distribution profile of FIG. 8B is obtained by simulation conducted with regard to the cross-section represented in FIG. 8A. FIG. 9B, on the other hand, shows the distribution profile of electric field strength in the channel layer 12 for the MESFET of FIG. 1 obtained by simulation with regard to the cross-section represented in FIG. 9A.

Referring to FIGS. 8B and 9B, it can be seen that there appears a peak of electric field strength in the vicinity of the gate drain edge in any of FIGS. 8B and 9B, wherein it can be seen that the maximum of the electric field strength takes the value of about $9 \times 10^5$ V/cm in the example of FIG. 9B, while in the example of FIG. 8B, the maximum electric field strength is reduced to about $7 \times 10^5$ V/cm. Further, it can be seen that there appears a small peak adjacent to the main peak corresponding to the drain edge, due to the existence of the extension part 25A of the gate electrode 25.

Further, the MESFET of the present invention represented in FIG. 3 achieves the desired suppressing of the gate leakage current not only by way of using the Γ-shaped gate electrode 25 but also by forming the drain opening 14A in the cap layer 14 in correspondence to the drain region 17 as set forth in FIG. 3. In the construction of FIG. 3, the drain electrode 17A makes a direct contact with the channel layer 12 via the opening 13A formed in the Schottky contact layer 13. Thus, the effect of surface depletion layer formed on the exposed surface of the Schottky contact layer 13 is reduced, and a low-resistance contact is realized.

Figure 10A:
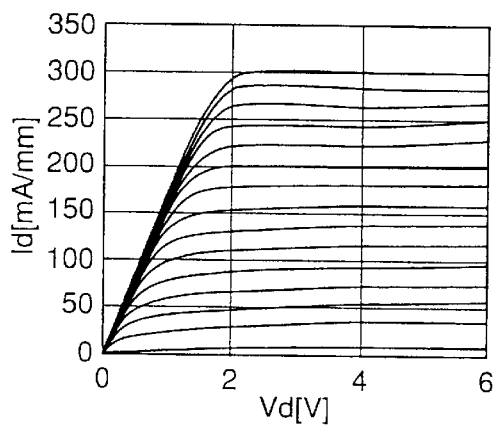
FIGS. 10A and 10B are further diagrams explaining the principle of the present invention.
Figure 10B:
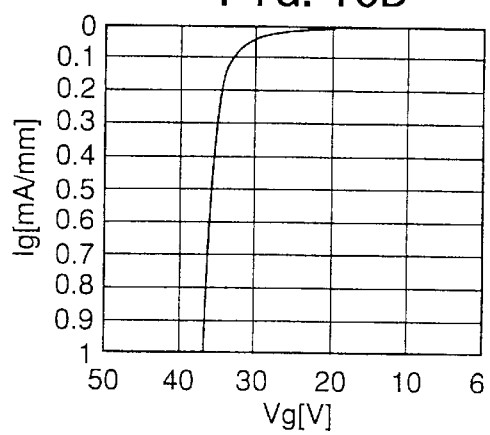
Figure 11A:
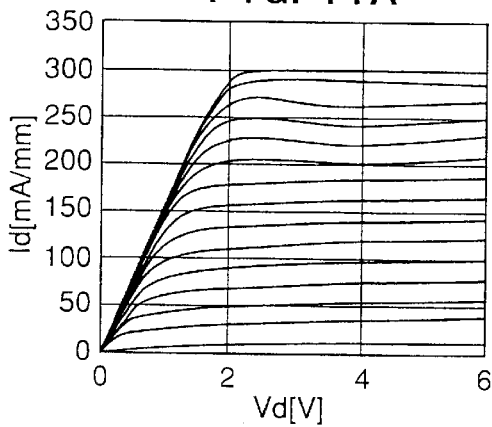
FIGS. 11A and 11B are further diagrams explaining the principle of the present invention.
Figure 11B:
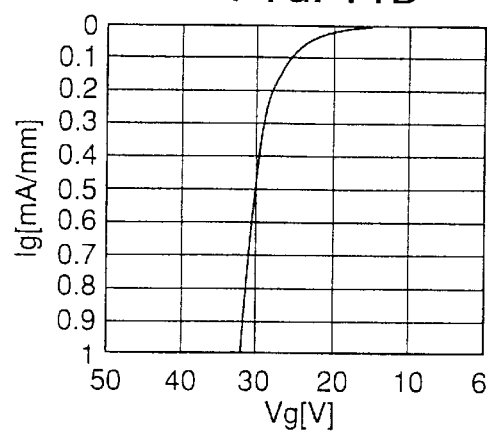

FIGS. 10A and 10B respectively show a drain current versus drain voltage ($I_d$-$V_d$) characteristic and a gate current versus gate voltage ($I_g$-$V_g$) characteristic for the MESFET of FIG. 3, while FIGS. 11A and 11B show an $I_d$-$V_d$ characteristic and an $I_g$-$V_g$ characteristic of the MESFET of FIG. 1 respectively. It should be noted that the MESFET of FIGS. 10A and 10B and the MESFET of FIGS. 11A and 11B have the same layered structure, the same gate length, and the same gate width. Further, the cap layer 14 is formed to have a thickness of 130 nm and the passivation film 18 is formed to have a thickness of 50 nm in both cases.

Comparing FIGS. 10A and 11A, it can be seen that a generally identical $I_d$-$V_d$ characteristic is obtained in both cases of the MESFET of FIG. 3 and the MESFET of FIG. 1. On the other hand, comparison of FIGS. 11A and 11B reveals the fact that the gate current $I_g$ of as much as 0.4 mA/mm is reached already when the gate voltage $V_g$ has reached the level of 30V in the conventional MESFET as represented in FIG. 11B. In the case of the MESFET of the present invention, on the contrary, it can be seen from FIG. 10B that the gate current $I_g$ takes the value of less than 0.05 mA/mm when the gate voltage $V_g$ is set to 30 V.

The result of FIG. 10B indicates that the MESFET of the present invention is characterized by the gate breakdown voltage ($V_{gd0}$) of about 30 V, while this value is improved remarkably over the conventional value of $V_{gd0}$ of 24.5 V, which is obtained for the conventional MESFET from the relationship of FIG. 10A.

Figure 12:
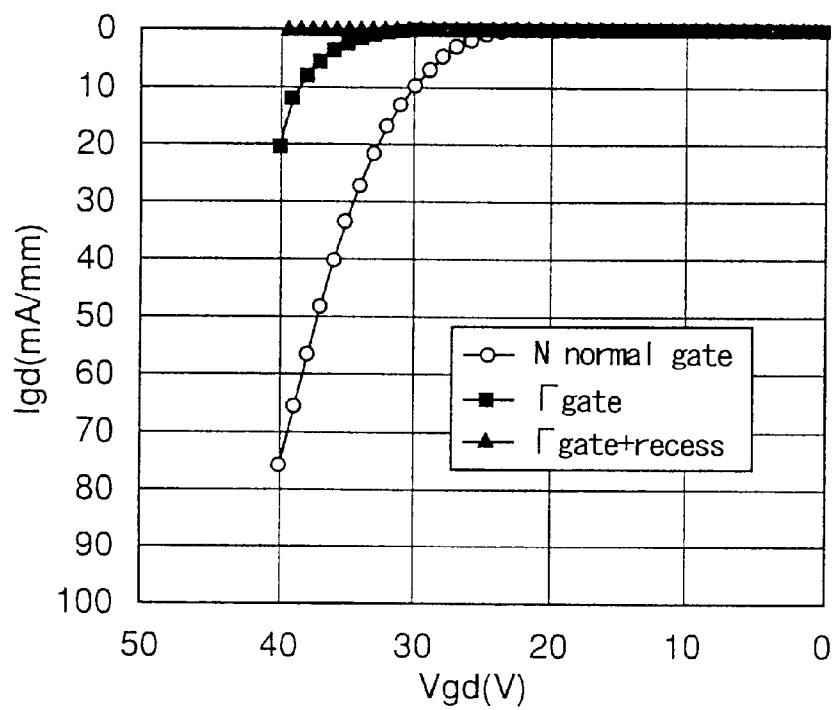
FIG. 12 is a further diagram explaining the principle of the present invention.

FIG. 12 shows the gate-drain breakdown characteristics for the MESFET of FIG. 3 in comparison with the gate-drain breakdown characteristic of the conventional MESFET of FIG. 1, wherein ▲ represents the characteristics of the MESFET of FIG. 3, while ● represents the characteristic of the MESFET of FIG. 1. Further, ■ in FIG. 12 represents the case in which the drain opening 14A and the opening 13A of the MESFET of FIG. 3 are omitted and the drain electrode 17A is provided directly on the cap layer 14. In FIG. 12, the horizontal axis represents the gate-drain voltage $V_{gd}$, while the vertical axis represents the gate-drain current $I_{gd}$.

By using the Γ-shaped gate electrode 25, the gate-drain breakdown characteristic of the MESFET is improved remarkably as can be seen in FIG. 12, while it is also clear from FIG. 12 that the construction of forming the opening 14A in the cap layer 14 and the opening 13A in the Schottky contact layer 13 and forming the drain electrode 17A directly in contact with the channel layer 12 in the opening 13A, contributes also to the improvement of the gate-drain breakdown characteristic substantially. This indicates that the foregoing construction of FIG. 3 is effective for interrupting the leakage current path (2) explained with reference to FIG. 2.

In the MESFET of the present invention, the effect of improvement of the gate breakdown voltage $V_{gd0}$ achieved by the use of the Γ-shaped gate electrode 25 changes depending on the thickness of the passivation film 18 as explained with reference to FIGS. 5 and 6.

Figure 13:
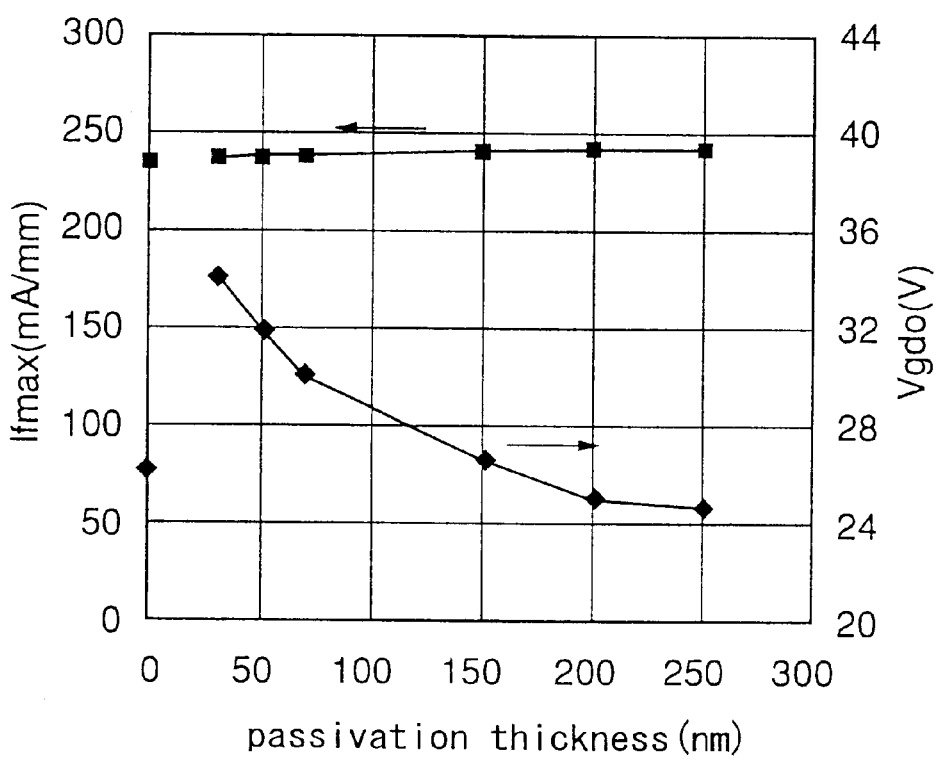
FIG. 13 is a further diagram explaining the principle of the present invention.

FIG. 13 shows the relationship between the saturated drain current $I_{fmax}$ and the breakdown voltage $V_{gd0}$ for the MESFET of FIG. 3 for the case in which the cap layer 14 is formed with the thickness of 130 nm and the thickness of the passivation film 18 is changed from 0 to 250 nm.

Referring to FIG. 13, it can be seen that the saturated drain current $I_{fmax}$ maintains a generally constant value of about 240 mA/mm irrespective of the thickness of the passivation film 18, while the value of the gate breakdown voltage $V_{gd0}$ increases with decreasing thickness of the passivation film 18 in the range smaller than 250 nm and reaches a value of about 30 V when the passivation film 18 has a thickness of 70 nm. When the passivation film 18 has a thickness of about 35 nm, the gate breakdown voltage $V_{gd0}$ achieves the value of as large as about 34 V.

The result of FIG. 13 indicates that, in order to exploit the advantageous effect of the Γ-shaped gate electrode 25, it is necessary to set the thickness of the passivation film 18 to be less than about 100 nm, preferably less than 70 nm.

When the thickness of the passivation film 18 is reduced below 35 nm, on the other hand, there arises a difficulty of forming a uniform film, particularly when an SiN film is used for the passivation film 18. Further, when the thickness of the passivation film 18 is excessively small, there tends to occur a concentration of electric field on the cap layer 14, while such a concentration of electric field tends to cause the problem of avalanche breakdown. It can be seen in FIG. 13 that the breakdown voltage is degraded remarkably when the thickness of the passivation film 18 is reduced to zero.

Further, in view of the result of FIGS. 5 and 6 noted before, it is understood that the breakdown voltage $V_{gd0}$ of the MESFET of the present invention changes depending on the thickness of the cap layer 14. Thus, when the thickness of the cap layer 14 is excessive, it is thought that the effect of the electrons accumulated underneath the gate extension part 25A causing the desired deformation of the potential surface is degraded. If the thickness of the cap layer 14 is excessively small, on the other hand, the depletion layer originating from the foregoing gate extension part 25A may reach the drain edge of the gate electrode 25 and the space charges associated with the depletion region may induce an additional electric field.

Thus, the inventor of the present invention has investigates the relationship between the gate breakdown voltage $V_{gd0}$ and saturated drain current $I_{fmax}$ for the MESFET of FIG. 3 while changing the thicknesses of the cap layer 3 variously.

Figure 14:
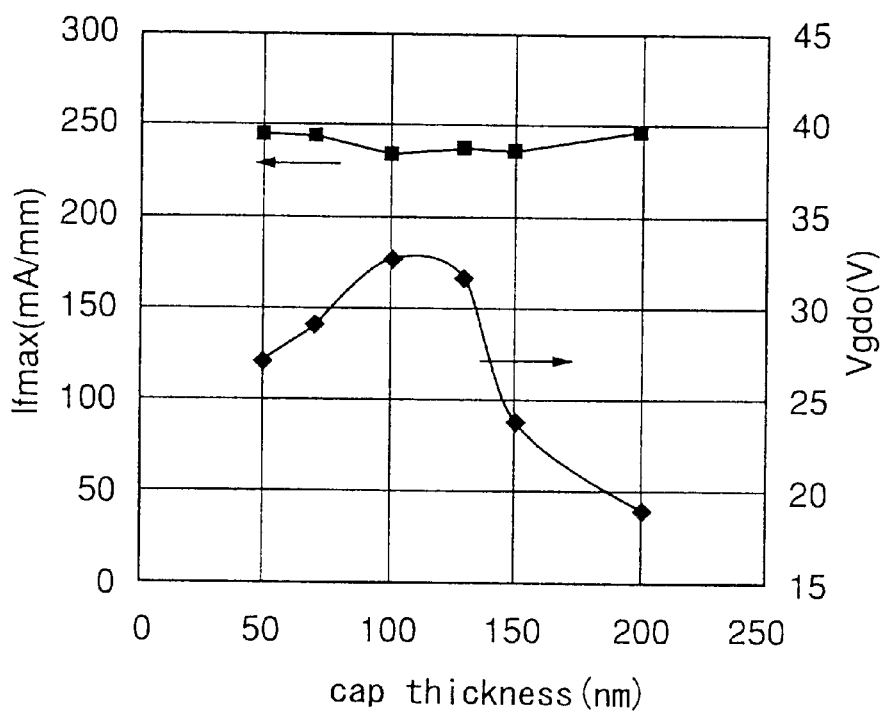
FIG. 14 is a further diagram explaining the principle of the present invention.

FIG. 14 shows the result of the foregoing investigation.

Referring to FIG. 14, the gate breakdown voltage $V_{gd0}$ increases with decreasing thickness of the cap layer 14 in the region in which the cap layer 14 has a thickness of 200 nm or less and reaches a maximum when the cap layer 14 has a thickness of about 110 nm. With further decrease of the cap layer 14, the breakdown voltage $V_{gd0}$ starts to decrease. From this, it is concluded that the thickness of the cap layer 14 should be in the range of 70–130 nm, in which range the maximum of the breakdown voltage $V_{gd0}$ is included.

In order to improve the breakdown voltage, there has been a proposal, according to Chen, Chang-Lee, et al., IEEE Electron Device Letters 13, 1992, June, No.6, 1992 or Zhang, N. -Q., et al., Solid State Devices and Materials, 1999, pp,212–213, to extend the gate electrode in the direction of the drain region. However, the structure of Chen-Lee Chen, et. al. cannot avoid the problem of large gate leakage current associated with the structure thereof in which the gate extension part makes a direct contact with the GaAs cap layer. Further, the gate extension part is formed also in the direction of the source region in the proposal of Chang-Lee Chen, while such a construction causes increase of gate-source capacitance $C_{gs}$ and degradation of high-frequency performance.

In the structure of N. -Q. Zhang, et al, on the other hand, no cap layer is provided and the gate extension part makes a direct contact with the SiN film that is formed on the Schottky layer with the thickness of 200 nm. In such a structure, the depletion region originating from the gate extension part penetrates deeply into the substrate at the drain edge part of the gate electrode, and the positive space charges associated with the depletion region tend to provide adversary effect to the desired relaxation of the electric flux line density. Thus, it is not possible to realize sufficient breakdown voltage in the device structure of N. -Q. Zhang, et al., even in the case the gate electrode includes the gate extension part extending toward the drain region.

Contrary to the foregoing, the present invention achieves effective improvement of breakdown voltage of a MESFET by using the Γ-shaped gate electrode in combination with the optimization of thickness of the passivation film and the cap layer underneath the extension part of the Γ-shaped gate electrode.

Further, it is noted that there is disclosed a structure in Japanese Laid-Open Patent Publication 5-326563 in which a Γ-shaped gate electrode is provided on an insulation film. This reference uses the Γ-shaped gate electrode for the purpose of reducing the gate resistance and further the gate-source capacitance $C_{gs}$, and thus, the foregoing insulation film is formed to have an increased thickness underneath the extension part of the Γ-shaped gate electrode. In the case an $SiO_2$ film is used for the insulation film, the insulation film has a thickness of 120 nm.

Thus, the desired improvement of the breakdown voltage cannot be achieved by the structure of the Japanese Laid-Open Patent Publication 5-326563, even when the Γ-shaped gate electrode is used. In the case a dense SiN film is used for the insulation film, on the other hand, the SiN film is generally formed with a reduced thickness due to the small growth rate thereof, while the use of such a thin SiN film causes the problem of increased gate capacitance. Thus, it is difficult to use an SiN film, in the structure of Japanese Laid-Open Patent Publication 5-326563, for the insulation film underneath the Γ-shaped gate electrode, particularly in view of the object thereof of reducing the gate-source capacitance $C_{gs}$. It is therefore necessary in the foregoing prior art to use another material for the insulation film or realize the insulation film by way forming a void.

Contrary to the foregoing, the present invention achieves the desired improvement of the breakdown voltage by forming an SiN film underneath the gate extension part of the Γ-shaped gate electrode with a thickness of 70 nm or less.

First Embodiment

Figure 15:
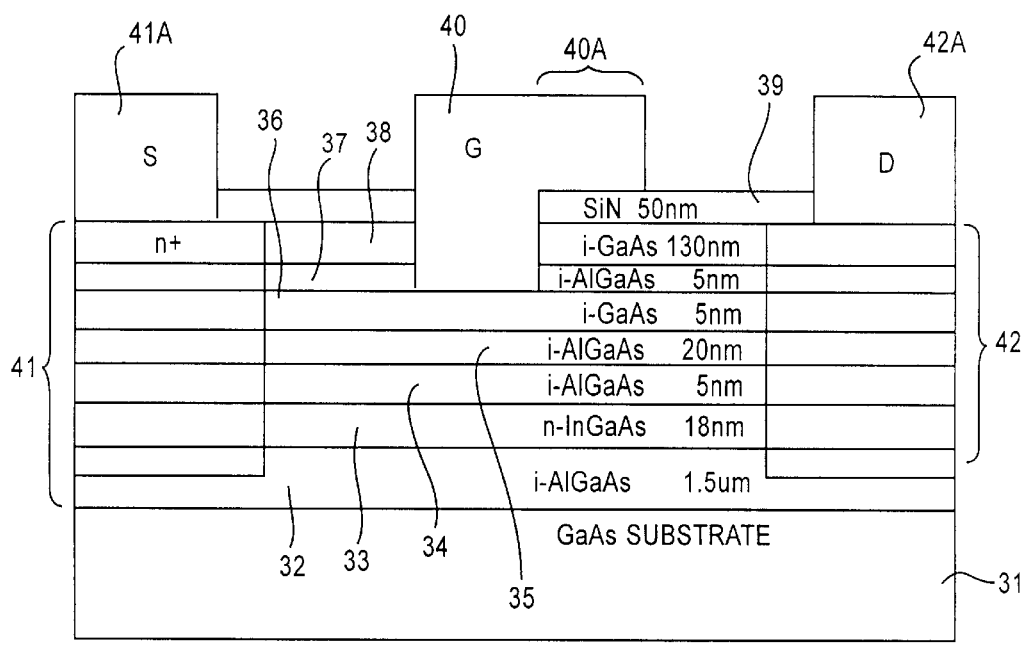
FIG. 15 is a diagram showing the construction of a MESFET according to a first embodiment of the present invention.

FIG. 15 shows the construction of a MESFET 30 according to a first embodiment of the present invention.

Referring to FIG. 15, the MESFET 30 is formed on a GaAs substrate 31 and includes a buffer layer 32 of undoped AlGaAs formed on the GaAs substrate 31, a channel layer 33 of n-type InGaAs formed on the buffer layer 32, an interface relaxation layer 34 of undoped AlGaAs formed on the channel layer 33, a Schottky contact layer 35 of undoped AlGaAs formed on the interface relaxation layer 34, a spacer layer 36 of undoped GaAs formed on the Schottky contact layer 35, an etching stopper layer 37 of undoped AlGaAs formed on the spacer layer 36, and a cap layer 38 of undoped GaAs formed on the etching stopper layer 37 with respective thicknesses of 1.5 μm, 18 nm, 5 nm, 20 nm, 5 nm, 5 nm, and 130 nm, wherein the layers 32–38 are formed epitaxially by an MOVPE process. Further, a passivation film 39 of SiN is formed on the cap layer 38 with a thickness of 50 nm.

In the structure of FIG. 15, it should be noted that buffer layer 32 has a composition represented by Al0.25Ga0.75As, while the channel layer 33 is doped by Si to a carrier concentration level of $1.5 \times 10^{18}$ $cm^{-3}$. In a typical example, the channel layer 33 has a composition that achieves a lattice matching with GaAs substrate 31. Further, it should be noted that the interface relaxation layer 34 is provided so as to suppress the roughening of the surface of the InGaAs channel layer 33 and has a composition of $Al_{0.25}Ga_{0.75}As$, which is identical with the composition of the buffer layer 32. Each of the Schottky contact layer 35 and the etching stopper layer 37 has a composition of $Al_{0.50}Ga_{0.50}As$.

In the MESFET 30 of FIG. 15, it should be noted that there is formed an opening in the channel region thereof through the SiN passivation film 39, the GaAs cap layer 38 and the etching stopper layer 37, such that the opening exposes the GaAs spacer layer 36. Further, a gate electrode 40 is formed in the opening in contact with the GaAs spacer layer 36.

At a first side of the gate electrode 40, there is formed a diffusion region 41 of n+-type as a source region of the MESFET 30, wherein the source region 41 is formed with an offset from the gate electrode 40 and extends toward the substrate 31. The source region 41 reaches the buffer layer 32. Similarly, there is formed another diffusion region 42 of n+-type at the opposite side of the gate electrode 40 with an offset therefrom as the drain region of the MESFET 30, wherein the drain region 42 is formed to reach the buffer layer 32.

In the source region 41, there is formed a source electrode 41A on the cap layer 38, while a drain electrode 42A is formed on the cap layer 38 in the drain region 42.

In the MESFET 30 of the present embodiment, it should further be noted that a gate extension part 40A extends from the gate electrode 40 over the SiN passivation film 39 toward the drain electrode 42A, and the gate electrode 40 form a Γ-shaped electrode together with the extension part 40A.

According to such a construction, the electric field at the drain edge part of the gate electrode 40 is relaxed, and the problem of gate leakage current caused by avalanche breakdown is successfully eliminated. As a result, the MESFET 30 has an improved breakdown characteristic and is capable of operating stably with large output power.

In the MESFET 30 of the present embodiment, it is preferably to set the thickness of the cap layer 38 in the range of 70–130 nm and to set the thickness of the passivation film 39 to be 70 nm or less.

FIGS. 16A–16E show the fabrication process of the MESFET 30 of FIG. 15.

Figure 16A:
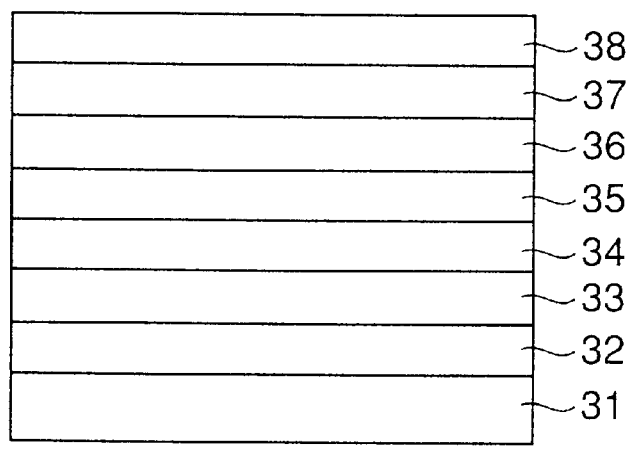
FIGS. 16A–16E are diagrams showing the fabrication process of the MESFET of FIG. 15.
Figure 16B:
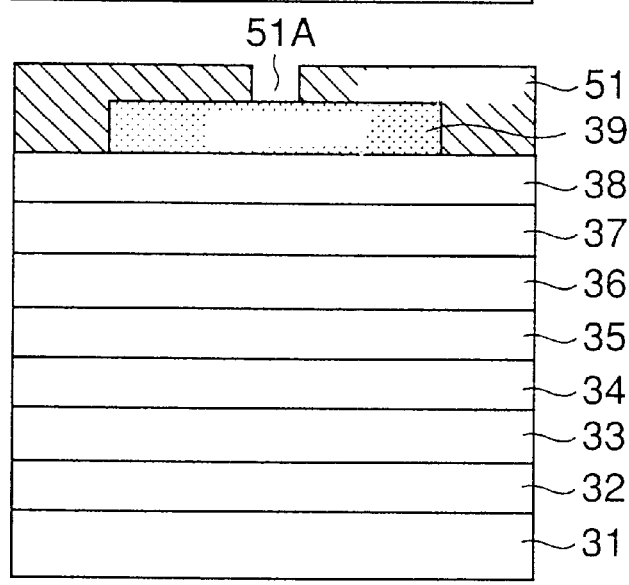

Referring to FIG. 16A, a layered structure including the semiconductor layers 32–38 is formed on the GaAs substrate 31 by depositing the layers 32–38 consecutively an MOVPE process, and an SiN pattern forming the SiN passivation film 39 is formed on the cap layer 38 in the step of FIG. 16B by a CVD process or plasma CVD process. Further, a resist film 51 is formed on the cap layer 38 such that the resist film 51 covers the SiN pattern 39. Further, the resist film 51 is patterned to form a resist opening 51A in correspondence to the part there the gate electrode 40 is to be formed.

Figure 16C:
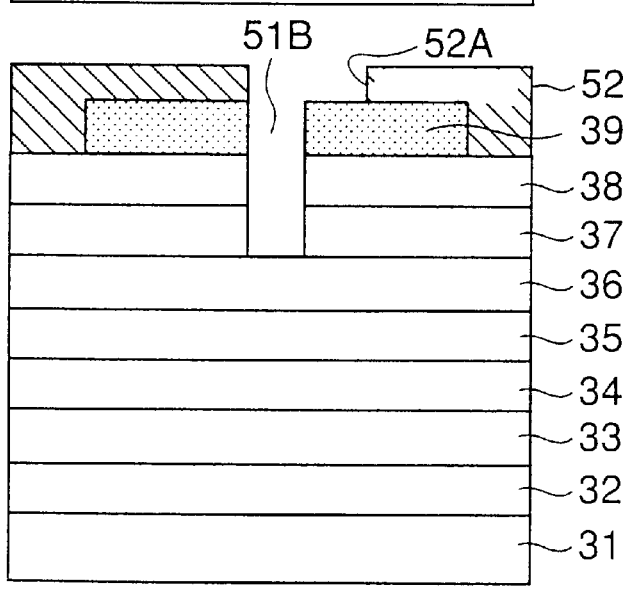

Next, in the step of FIG. 16C, the SiN pattern 39, the cap layer 38 and the etching stopper layer 37 are etched consecutively while using the resist film 51 as a mask, to form an opening 51B corresponding to the resist opening 51A such that the opening 51B penetrates through the SiN film 39, the cap layer 38 and the etching stopper layer 37 underneath the cap layer 38. Typically, the etching of the SiN film 39 is conducted by a dry etching process using $CF_4$/ $CHF_3$ as the etching gas, while the etching of the cap layer 38 is conducted by a dry etching process that uses $CCl_2F_2$/ He as the etching gas. Further, the etching stopper layer 37, which may be damaged as a result of the dry etching process, is removed by a wet etching process that uses $HNO_3$ as an etchant.

In the step of FIG. 16C, the resist film 51 is removed further, and another resist film 52 is newly formed on the cap layer 38 such that the resist film 52 covers the SiN pattern 39. Further, a resist opening 52A is formed in the resist film 52 in the step of FIG. 16C in correspondence to the gate electrode extension part 40A such that the resist opening 52A includes therein the opening 51B.

Figure 16D:
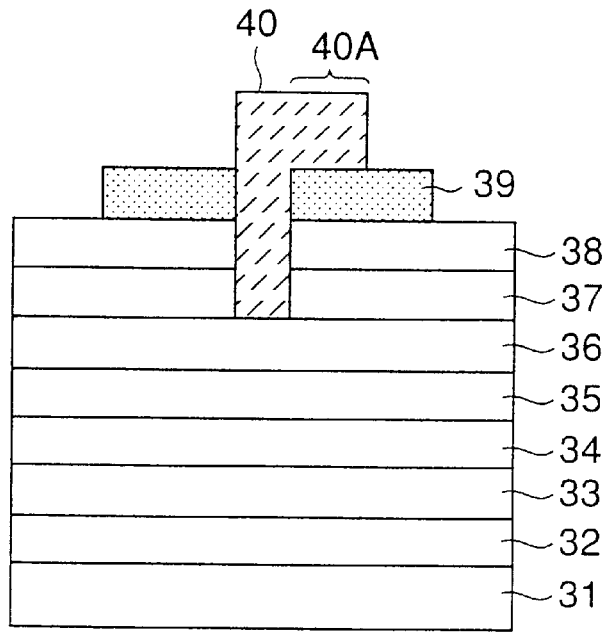

Next, in the step of FIG. 16D, an Al layer is deposited on the structure of FIG. 16C with a thickness of about 300 nm such that the Al layer fills the opening 51B and the resist opening 52A, followed by a lift-off process of the resist film 52. As a result, the Γ-shaped gate electrode 40 having the extension part 40A is formed in correspondence to the opening 51B and the resist opening 52A.

Figure 16E:
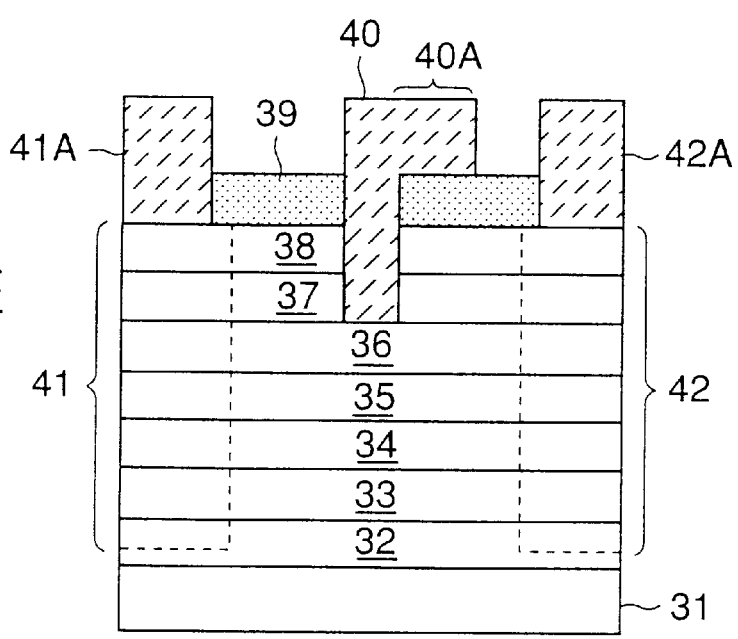

Next, in the step of FIG. 16E, an ion implantation process of Si+ is conducted into the layered semiconductor structure while using the SiN pattern 39 and the gate electrode 40, including the gate extension part 40A, as a self-alignment mask. Typically, the ion implantation process is conducted under an acceleration voltage of 150–170 keV with a dose of $1\times10^{13}$ cm$^{-2}$. Further, a thermal activation process is conducted at 850° C. for 20 minutes for activating the Si atoms thus introduced into the source region 41 and the drain region 42. As a result, there is formed an n+-type diffusion region extending from the cap layer 38 to the top part of the buffer layer 32 in each of the source region 41 and the drain region 42.

Further, an ohmic electrode of AuGe/Au structure is formed on any of the source region 41 and the drain region 42, by stacking an AuGe layer and an Au layer with respective thicknesses of 50 nm and 300 nm, followed by an alloying process conducted at 450° C. for 2 minutes. Thus, the source electrode 41A and the drain electrode 42A are formed respectively on the source region 41 and the drain region 42.

In the present embodiment, it is also possible to use an n-type GaAs layer or n-type InGaP layer for the channel layer 33. Further, the use of an undoped AlInGaP layer for the Schottky contact layer 35 is also possible.

Second Embodiment

Figure 17:
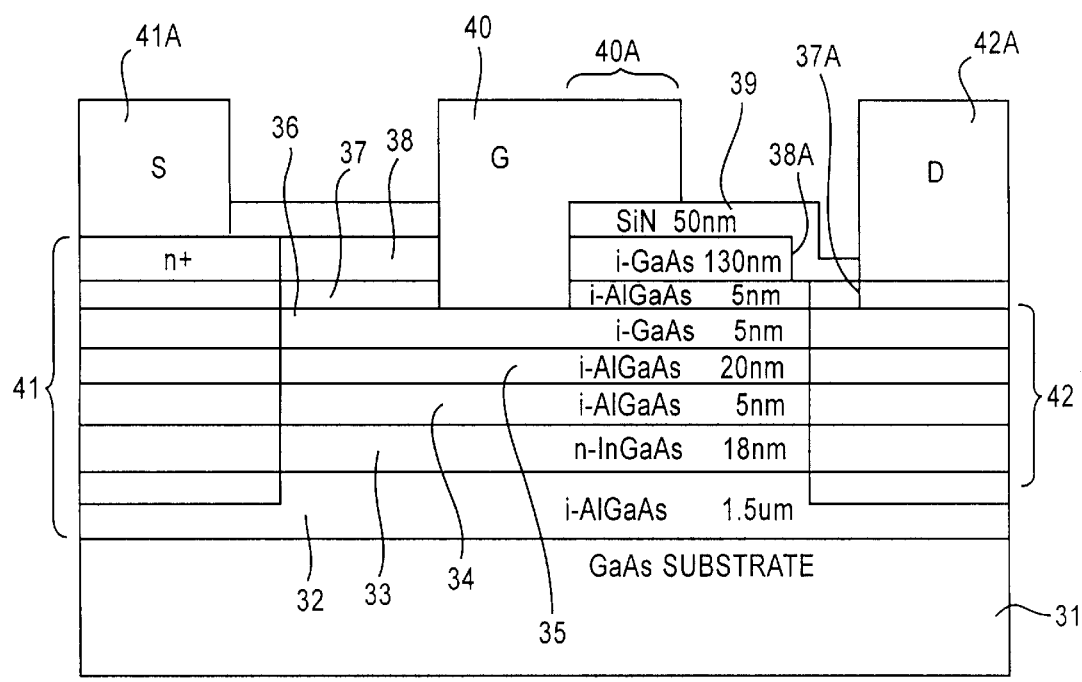
FIG. 17 is a diagram showing the construction of a MESFET according to a second embodiment of the present invention.

FIG. 17 shows the construction of a MESFET 60 according to a second embodiment of the present invention, wherein those parts corresponding to the parts described previously are designated by the same reference numerals and the description there of will be omitted.

Referring to FIG. 17, the MESFET 60 has a construction similar to that of the MESFET 30 of FIG. 15, except that there is formed an opening 38A exposing the etching stopper layer 37 in the cap layer 38 in correspondence to the drain region 42. Further, the etching stopper layer 37 is formed with an opening 37A that exposes the spacer layer 36 underlying the layer 37.

In the present embodiment, the drain electrode 42A makes an ohmic contact with the spacer layer 36 in the foregoing opening 37A. Further, the passivation film 39 covering the cap layer 38 extends continuously over the sidewall surface of the opening 38A and the surface of the etching stopper film 37. According to such a construction, the gate leakage path between the cap layer 38 and the drain electrode 42A is interrupted.

Further, because of the fact that the surface of the etching stopper film 37 is covered by the SiN passivation film 39 in the opening 38A in the MESFET 60 of the present embodiment, the problem of formation of surface depletion region at the surface of the etching stopper film 37 is effectively suppressed, and degradation of operational performance of the MESFET 60, caused by such a surface depletion region, is effectively and successfully eliminated.

In the present embodiment, the opening 38A may be formed by a dry etching process of the cap layer 38 conducted by using an etching gas of CCl$_2$F$_2$/He under presence of a suitable resist mask. The dry etching process is continued until the etching stopper layer 37 is exposed. The opening 37A, on the other hand, can be formed by a wet etching process of the etching stopper film 37 that uses HNO$_3$ as an etchant under presence of a suitable resist mask.

Third Embodiment

Figure 18:
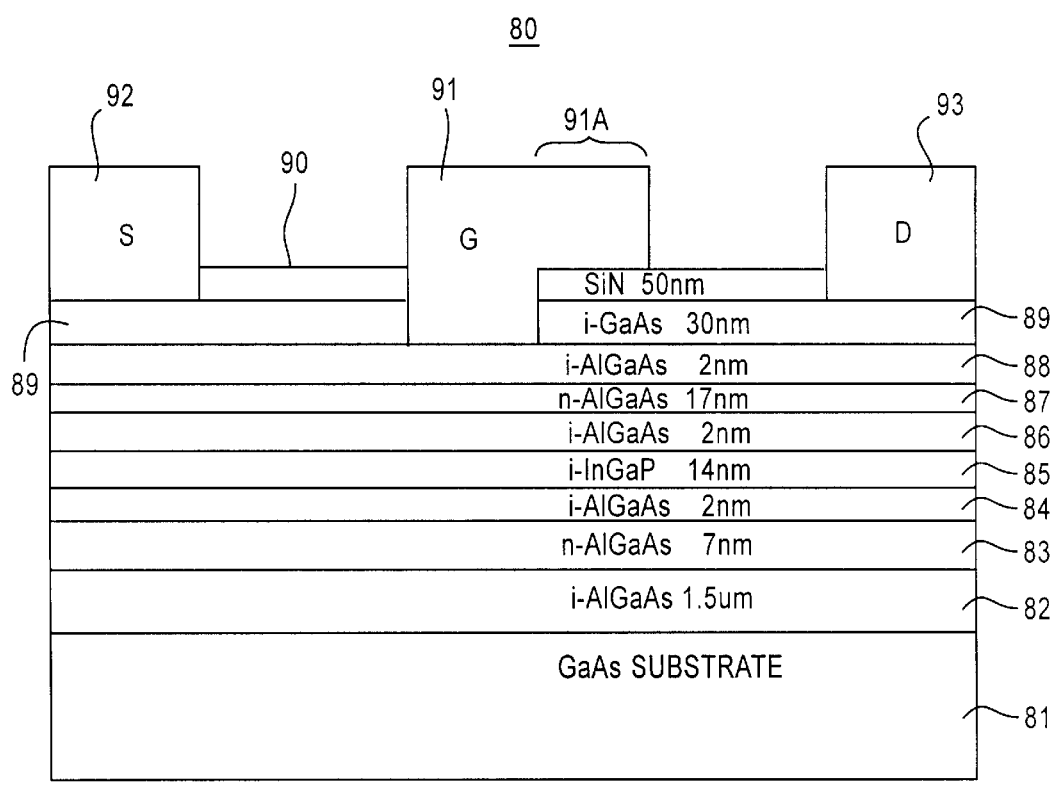
FIG. 18 is a diagram showing the construction of a HEMT according to a third embodiment of the present invention.

FIG. 18 shows the construction of a HEMT 80 according to a third embodiment of the present invention.

Referring to FIG. 18, the HEMT 80 is formed on a semi-insulating GaAs substrate 81 and includes a buffer layer 82 of undoped AlGaAs formed on the GaAs substrate 81, a first electron supplying layer 83 of n-type AlGaAs formed on the buffer layer 82, a first relaxation layer 84 of undoped AlGaAs formed on the first electron supplying layer 83, a channel layer 85 of undoped InGaP formed on the first relaxation layer 84, a second relaxation layer 86 of undoped AlGaAs formed on the channel layer 85, a second electron supplying layer 87 of n-type AlGaAs formed on the second relaxation layer 86, a Schottky contact layer 88 of undoped AlGaAs formed on the second electron supplying layer 87, and a cap layer 89 of undoped GaAs formed on the Schottky contact layer 88, with respective thicknesses of 1.5 μm, 7 nm, 2 nm, 14 nm, 2 nm, 17 nm, 2 nm, and 30 nm. The layers 82–89 are formed consecutively by an MOVPE process, and a passivation film 90 of SiN is formed on the cap layer 89 with a thickness of 50 nm. It should be noted that the relaxation layers 84 and 86 are provided so as to suppress the roughening of the upper and lower surfaces of the channel layer 85.

The buffer layer 82, the spacer layers 84 and 86 and the electron supplying layers 83 and 87 have a composition represented by Al0.25Ga0.75As, wherein the electron supplying layers 83 and 87 are doped by Si to a carrier density of $2\times10^{18}$ cm$^{-3}$. On the other hand, the undoped InGaP layer constituting the channel layer 83 has a lattice matching composition with the GaAs substrate 31. The Schottky contact layer 88 has a composition represented as Al$_{0.50}$Ga$_{0.50}$As.

In the HEMT 80 of FIG. 18, there is formed an opening through the SiN passivation film 90 and the underlying GaAs cap layer 89 in correspondence to the channel region, such that the opening exposes the AlGaAs etching stopper layer 88. Further, there is formed a gate electrode 91 in the foregoing opening in contact with the AlGaAs Schottky contact layer 88.

At a first side of the gate electrode 91, there is provided a source electrode 92 in ohmic contact with the cap layer 89, wherein the source electrode 92 is formed with an offset from the gate electrode 40. Further, a drain electrode 93 is formed in ohmic contact with the cap layer 89 at the other side of the gate electrode 91 with an offset from the gate electrode 91.

Further, the HEMT 80 includes a gate extension part 91A extending from the gate electrode 91 over the SiN passivation film 90 in the direction of the drain electrode 93, wherein the gate electrode 91 forms, together with the gate extension part 91A, a Γ-shaped gate electrode.

According to the foregoing construction of the present embodiment, the electric field is relaxed in the vicinity of the drain edge of the gate electrode 91, and the gate leakage current caused by the avalanche breakdown is suppressed effectively. Associated therewith, the breakdown characteristic of the HEMT 80 is improved, and the HEMT 80 provides a stable operation with large output power.

It should be noted that the HEMT 80 of the present embodiment can be fabricated according to a process similar to the process of forming the MESFET 30 of the previous embodiment.

In the present embodiment, it should be noted that the channel layer 85 is not limited to undoped InGaP, but may be formed also of undoped GaAs or undoped InGaAs. Further, the electron supplying layers 83 and 87 are not limited to n-type AlGaAs but may be formed also of n-type AlInGaP. Further, it is possible to us undoped AlGaInP for the Schottky contact layer 88 in place of the undoped AlGaAs layer.

While not illustrated, it is possible to provide a spacer layer and an etching stopper layer similar to the spacer layer 36 and the etching stopper layer 37 between the Schottky contact layer 88 and the cap layer 89.

Fourth Embodiment

Figure 19:
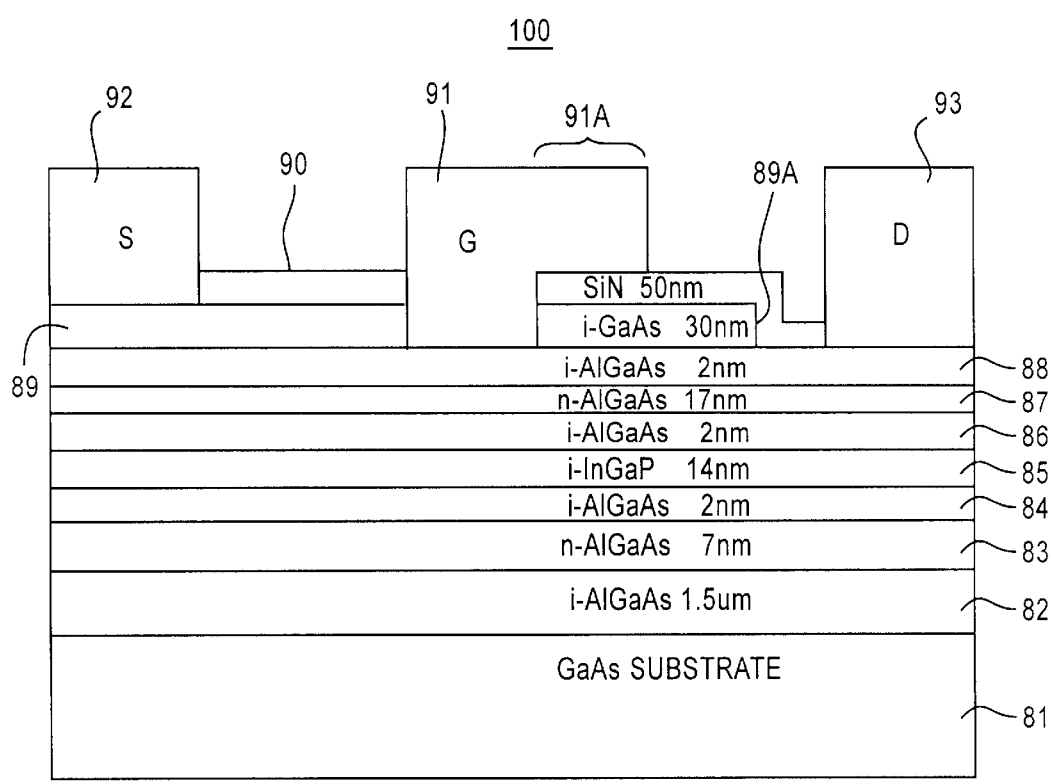
FIG. 19 is a diagram showing the construction of a HEMT according to a fourth embodiment of the present invention.

FIG. 19 shows the construction of a HEMT 100 according to a fourth embodiment of the present invention, wherein those parts corresponding to the parts described previously are designated by the same reference numerals and the description thereof will be omitted.

Referring to FIG. 19, the HEMT 100 has a construction similar to that of the HEMT 80 of FIG. 18, except that there is formed an opening 89A exposing the etching stopper layer 88 in the cap layer 89 in correspondence to the drain region, and the drain electrode 93 is formed in the foregoing opening 89A. Further, the passivation film 90 covering the cap layer 89 extends continuously over the sidewall surface and over the surface of the Schottky contact layer 88. As a result of such a construction, the gate leakage current path between the cap layer 89 and the drain electrode 93 is disconnected. Further, the construction of the present embodiment provides the feature of covering the surface of the etching stopper layer 88 by the SiN passivation film 90 in the opening 89A. As a result, the problem of the surface depletion layer formed at the exposed surface of the etching stopper layer 88 causing degradation of the operational performance of the HEMT 100 is effectively eliminated.

In the present embodiment, the opening 89A may be formed by applying a dry etching process to the cap layer 89 in combination with a suitable resist mask, while using an etching gas of $CCl_2F_2$/He until the etching stopper layer 88 is exposed.

Further, the present invention is not limited to the embodiments described heretofore, but various variations and modifications may be made without departing from the scope of the invention.

What is claimed is:

1. A compound semiconductor device, comprising:
   a substrate;
   a channel layer formed on said substrate;
   a cap layer formed on said channel layer;
   an insulating film formed on said cap layer;
   a gate recess opening penetrating through said insulating film and said cap layer;
   an n-type source region extending from a surface of said cap layer and reaching said channel layer at a first side of a gate electrode;
   an n-type drain region extending from a surface of said cap layer and reaching said channel layer at a second side of said gate electrode;
   a source electrode contacting with said source region electrically; and
   a drain electrode contacting with said drain region electrically,
   said gate electrode having a Γ shape and extending over said insulating film from said gate recess opening in a direction of said second side,
   a total thickness of said insulating film and said cap layer being set such that there is formed an electric field right underneath an extending part of said gate electrode such that said electric field has a component acting in a direction perpendicular to a principal surface of said substrate with a magnitude commensurate with a magnitude of an electric field component acting parallel to said principal surface in a part of said channel layer located right underneath said extending part of said gate electrode.

2. A compound semiconductor device as claimed in claim 1, wherein said electric field right underneath said extension part of said gate electrode has a strength, in said cap layer, smaller than a strength of an electric field at an edge part of said extension part located near said drain region.

3. A compound semiconductor device as claimed in claim 1, wherein said insulation film has a thickness of 70 nm or less.

4. A compound semiconductor device as claimed in claim 1, wherein said cap layer has a thickness in the range of 70–130 nm.

5. A compound semiconductor device as claimed in claim 1, wherein said insulation film comprises an SiN film.

6. A compound semiconductor device as claimed in claim 1, wherein said drain electrode makes an ohmic contact with said cap layer in said drain region.

7. A compound semiconductor device as claimed in claim 1, wherein said cap layer has a drain opening in said drain region, and said drain electrode is provided in said drain opening.

8. A compound semiconductor device as claimed in claim 7, wherein said source electrode makes an ohmic contact with said cap layer in said source region.

9. A compound semiconductor device as claimed in claim 1, further including a Schottky contact layer of an undoped semiconductor material between said channel layer and said cap layer.

10. A compound semiconductor device as claimed in claim 1, further including an electron supplying layer of an n-type semiconductor material between said channel layer and said cap layer, and wherein said channel layer includes therein a two-dimensional electron gas.

* * * * *